US010410926B2

(12) United States Patent
Czornomaz et al.

(10) Patent No.: US 10,410,926 B2
(45) Date of Patent: Sep. 10, 2019

(54) FABRICATING CONTACTS OF A CMOS STRUCTURE

(71) Applicant: International Business Machines Corporation, Armonk, NY (US)

(72) Inventors: Lukas Czornomaz, Zurich (CH); Veeresh V. Deshpande, Zurich (CH); Vladimir Djara, Kilchberg (CH); Pouya Hashemi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/885,945

(22) Filed: Feb. 1, 2018

(65) Prior Publication Data
US 2018/0294193 A1 Oct. 11, 2018

Related U.S. Application Data

(63) Continuation of application No. 15/481,527, filed on Apr. 7, 2017, now Pat. No. 9,997,409.

(51) Int. Cl.
*H01L 29/66* (2006.01)
*H01L 29/417* (2006.01)
(Continued)

(52) U.S. Cl.
CPC .. *H01L 21/823418* (2013.01); *H01L 21/3065* (2013.01); *H01L 21/30625* (2013.01);
(Continued)

(58) Field of Classification Search
CPC ...... H01L 21/823418; H01L 21/823425; H01L 29/41783
See application file for complete search history.

(56) References Cited

U.S. PATENT DOCUMENTS 7,615,831 B2  11/2009  Zhu et al.
8,940,633 B2   1/2015  Cai et al.
(Continued)

OTHER PUBLICATIONS

Czornomaz et al., "Fabricating Contacts of a CMOS Structure," U.S. Appl. No. 15/481,527, filed Apr. 7, 2017.
(Continued)

*Primary Examiner* — Daniel P Shook
(74) *Attorney, Agent, or Firm* — Cantor Colburn LLP; Daniel Morris

(57) ABSTRACT

The invention relates to a method comprising providing a substrate with a channel layer, forming a gate stack structure on the channel layer and forming a raised source and a raised drain on the channel layer. The method further comprises depositing in a non-conformal way an oxide layer above the gate stack structure, the raised source and the raised drain. A first void above the raised source and a second void above the raised drain gate are created adjacent to vertical edges of the gate stack structure. The method further comprises etching the oxide layer for a predefined etching time, thereby removing the oxide layer above the raised source and the raised drain, while keeping it at least partly on the channel layer. Contacts are formed to the raised source and the raised drain. The invention also concerns a corresponding computer program product.

15 Claims, 9 Drawing Sheets

(51) Int. Cl.
  *H01L 21/8234* (2006.01)
  *H01L 21/84* (2006.01)
  *H01L 21/306* (2006.01)
  *H01L 21/3065* (2006.01)

(52) U.S. Cl.
  CPC .............. *H01L 21/823425* (2013.01); *H01L 21/823475* (2013.01); *H01L 21/84* (2013.01); *H01L 29/41783* (2013.01); *H01L 29/66545* (2013.01); *H01L 29/66553* (2013.01)

(56) References Cited

U.S. PATENT DOCUMENTS

| | | |
|---|---|---|
| 9,059,271 B2 | 6/2015 | Guo et al. |
| 2012/0299101 A1 | 11/2012 | Babich et al. |
| 2016/0043075 A1* | 2/2016 | Lavoie .................. H01L 27/088 257/365 |

OTHER PUBLICATIONS

Czornomaz et al., "Fabricating Contacts of a CMOS Structure," U.S. Appl. No. 15/800,243, filed Nov. 1, 2017.
List of IBM Patents or Patent Applications Treated as Related; Date Filed: Feb. 1, 2018, 2 pages.
A. Majumdar et al., "CMOS-Compatible Self-Aligned In0.53Ga0.47As MOSFETs With Gate Lengths Down to 30 nm," IEEE Transactions on Electron Devices, vol. 61, No. 10, Oct. 2014, pp. 3399-3404.
S. B. Samavedam et al., "Elevated source drain devices using silicon selective epitaxial growth," J. Vac. Sci. Technol. B 18(3), May-Jun. 2000, pp. 1244-1250.

* cited by examiner

FABRICATING CONTACTS OF A CMOS STRUCTURE

DOMESTIC PRIORITY

This application is a continuation of U.S. application Ser. No. 15/481,527, filed Apr. 7, 2017, the contents of which are incorporated by reference herein in its entirety.

BACKGROUND

The embodiments of the invention relate generally to the fabrication of semiconductor devices and more particularly to the fabrication of contacts of a CMOS structure.

In devices with raised source and drains the source and drain layers are formed above the channel material to achieve low series resistance.

Leading edge CMOS industry is facing strong limitations in lithographic scaling for 10 nm node and beyond. The formation of contacts at advanced nodes is challenging in view of high process complexity and high costs. High-k gate dielectrics are used to scale down the thickness of the gate dielectric.

SUMMARY

According to aspects of the invention, a method for forming a field effect transistor is provided. The method comprises operations of providing a substrate with a channel layer, forming a gate stack structure on the channel layer and forming a raised source and a raised drain on the channel layer. The method comprises a further operation of depositing in a non-conformal way an oxide layer above the gate stack structure, the raised source and the raised drain. Thereby a first void above the raised source and a second void above the raised drain are created adjacent to vertical edges of the gate stack structure. The method comprises a further operation of etching the oxide layer for a predefined etching time, thereby removing the oxide layer above the raised source and the raised drain, while keeping it at least partly on the channel layer. A further operation comprises forming contacts to the raised source and the raised drain.

According to aspects of the invention, a computer program product is provided. The computer program product comprises a computer readable storage medium having computer readable program code embodied therewith, the computer readable program code configured to cause one or more semiconductor processing apparatus to perform operations of forming a gate stack structure on a channel layer of a substrate and forming a raised source and a raised drain on the channel layer. The computer readable program code is further configured to deposit in a non-conformal way an oxide layer above the gate stack structure, the raised source and the raised drain, thereby creating a first void above the raised source and a second void above the raised drain adjacent to vertical edges of the gate stack structure. The computer readable program code is further configured to etch the oxide layer for a predefined etching time, thereby removing the oxide layer above the raised source and the raised drain, while keeping it at least partly on the channel layer and to form contacts to the raised source and the raised drain.

Embodiments of the invention will be described in more detail below, by way of illustrative and non-limiting examples, with reference to the accompanying drawings.

BRIEF DESCRIPTION OF THE DRAWINGS

FIGS. 1-14 show cross sectional views of successive stages of methods for fabricating a CMOS structure according to embodiments of the invention in which:

FIG. 1 shows a cross sectional view of a starting structure of a method using dummy gate structures;

FIG. 2 shows a cross-sectional view of the structure of FIG. 1 after the deposition of a liner;

FIG. 3 shows a cross-sectional view of the structure of FIG. 2 after the deposition of an oxide layer;

FIG. 4 shows a cross-sectional view of the structure of FIG. 3 after planarization of the oxide layer;

FIG. 5 shows a cross-sectional view of the structure of FIG. 4 after etching the oxide layer for a predefined etching time;

FIG. 6 shows a cross-sectional view of the structure of FIG. 5 after etching of the liner;

FIG. 7 shows a cross-sectional view of the structure of FIG. 6 after a deposition of a metal layer;

FIG. 8 shows a cross-sectional view of the structure of FIG. 7 after a planarization of the metal layer;

FIG. 9 shows a cross-sectional view of a starting structure 900 of a method using raised source/drains having a dual thickness;

FIG. 10 shows a cross-sectional view of the structure of FIG. 9 after growing second raised source/drain layers;

FIG. 11 shows a cross-sectional view of the structure of FIG. 10 after removing a liner and second sidewall spacers;

FIG. 12 shows a cross-sectional view of the structure of FIG. 11 after the deposition of an oxide layer;

FIG. 13 shows a cross-sectional view of a starting structure of a method using faceted raised source/drains;

FIG. 14 shows a cross-sectional view of the structure of FIG. 13 after the deposition of an oxide layer;

DETAILED DESCRIPTION

In reference to FIGS. 1-16, some general aspects and terms of embodiments of the invention are described first.

A semiconductor substrate may be a bulk semiconductor substrate, a substrate comprising an insulating layer such as a silicon on insulator (SOI) substrate or a hybrid substrate.

A high k-dielectric layer is a layer comprising a dielectric material having a higher dielectric constant k than $SiO_2$. $SiO_2$ has a dielectric constant k of 3.9 and accordingly dielectric materials having a dielectric constant k of more than 3.9 are denoted as high-k materials.

Embodiments of the invention provide methods for forming a field effect transistor and in particular methods for fabricating self-aligned contacts to a raised source and a raised drain of a field effect transistor.

FIGS. 1-8 show successive stages of a method for forming a field effect transistor according to embodiments of the invention. FIGS. 1-8 and the other Figures subsequently described below generally show enlarged cross-sectional views of initial, intermediate and final structures formed during the stages of the method. In any or all of the figures the dimensions may not be drawn to scale and may be shown in a simplified and schematic way to illustrate the features and principles of embodiments of the invention. Furthermore, the fillings of the elements and layers are chosen to ease the illustration of the respective structures, but the fillings do not have any specific meaning with respect to the material of the respective element/layer.

FIGS. 1-8 show successive stages for forming a field effect transistor utilizing "dummy gates".

Figure 1:
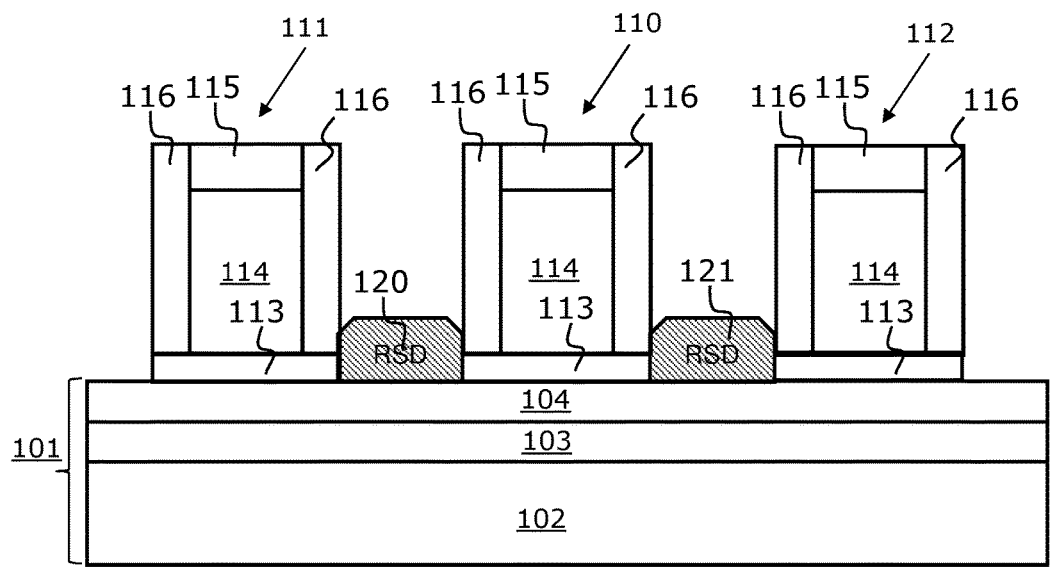

FIG. 1 illustrates a cross-sectional view of a starting structure 100. The starting structure 100 comprises a substrate 101. The substrate 101 is embodied as a semiconductor-on-insulator substrate comprising a base substrate layer 102, an insulating layer 103 and a channel layer 104 disposed on the insulating layer 103. The base substrate layer 102 may be e.g. embodied as a Si substrate. On the base substrate layer 102 the insulating layer 103 is provided. The insulating layer 103 may be embodied e.g. as a dielectric layer comprising $SiO_2$ and may be in the following also denoted as a buried oxide (BOX) layer. The thicknesses of the base substrate layer 102 and the insulating layer 103 can be any suitable thicknesses. On the insulating layer 103 the channel layer 104 is formed that comprises a semiconductor material. According to embodiments the semiconductor material of the channel layer 104 may be embodied as $Si_xGe_{1-x}$, where x=0 to 1. In other words, the first semiconductor material may be embodied as Silicon (Si), Germanium (Ge) or a SiGe alloy. In the following references to SiGe shall be understood as references to $Si_xGe_{1-x}$ where x=0 to 1.

According to embodiments of the invention, the semiconductor material of the channel layer 104 may be embodied as a group III-V compound material. According to embodiments of the invention, the semiconductor material of the channel layer 104 may be $In_xGa_{1-x}As$ where x=0 to 1, i.e. from GaAs to InAs. According to embodiments of the invention, the semiconductor material of the channel layer 104 may be InP or InGaSb. According to embodiments of the invention, further alloyed combinations of (In, Ga) and (As, Sb, P) may be used.

The channel layer 104 may have a thickness of, for example, about 5-50 nm that corresponds to a desired channel thickness of a subsequently formed field effect transistor (FET).

According to embodiments of the invention, the channel layer 104 could be formed directly on a bulk substrate, e.g. a bulk Si-substrate.

The substrate 101 may also be denoted as wafer 101.

SiGe is a useful material for the implementation of a P-Channel Field Effect Transistor (PFET) in view of its high hole mobility. Group III-V materials are useful materials for implementing a N-Channel Field Effect Transistor (NFET) as they exhibit a high electron mobility.

On the channel layer 104 a gate stack structure 110 has been formed. Furthermore, a first dummy gate stack structure 111 and a second dummy gate stack structure 112 have been formed next to the gate stack structure 110. The gate stack structure 110 comprises a gate dielectric layer 113, a gate metal layer 114, a gate cap layer 115 deposited on the gate metal layer 114 and sidewall spacers 116.

The gate dielectric layer 113 may be embodied as a high-k dielectric layer comprising $HfO_2$, HfON, HfSiON, $ZrO_2$, ZrON, $HfO_2$, HfON, $ZrO_2$, ZrON, $LaO_3$, La—Al—O, La—Lu—O, SiN or SiON. The gate metal layer 114 may comprise e.g. Ti, Hf, TiN or Al. The gate cap layer 115 may be in particular embodied as hard mask layer comprising SiN or $SiO_2$.

The formation of the gate dielectric layer 113, the formation of the gate metal layer 114 and the formation of the gate cap layer 115 may be performed by methods well known in the art, in particular by atomic layer deposition (ALD) or generally any other suitable methods such as chemical vapor deposition (CVD) methods. The sidewall spacers 116 may be in particular embodied as spacers comprising or consisting of SiN. The sidewall spacers 116 may also be formed by ALD or CVD techniques followed by a lithography and etching operation, e.g. by photolithography including application of a photoresist, light exposure, developing, etching and photoresist removal. According to other embodiments electron beam lithography or other suitable lithography methods may be used.

The first dummy gate stack structure 111 and the second dummy gate stack structure 112 are formed in the same or a similar way as the gate stack structure 110. Accordingly, the first dummy gate stack structure 111 and the second dummy gate stack structure 112 also comprise a gate dielectric layer 113, a gate metal layer 114, a gate cap layer 115 and sidewall spacers 116. The gate stack structure 110 may also be denoted as real gate stack structure 110.

Furthermore, a raised source 120 and a raised drain 121 have been formed on the channel layer 104. More particularly, the raised source 120 and the raised drain 121 have been formed adjacent to the gate stack structure 110 and adjacent to the first dummy gate structure 111 and to the second dummy gate structure 112 respectively. In other words, the raised source 120 has been formed between the gate stack structure 110 and the first dummy gate structure 111 and the raised drain 121 has been formed between the gate stack structure 110 and the second dummy gate structure 112. The raised source 120 and the raised drain 121 are also commonly referred to as RSD.

The formation of the sidewall spacers 116 as well as the formation of the raised source 120 and the formation of the raised drain 121 may be done by methods well known in the art using lithography operations to pattern and etch the spacers and selective epitaxy operations to deposit the raised source and the raised drain on the channel layer. In such devices with raised source and drains the source and drain layers are formed above the channel regions to achieve low series resistance.

Figure 2:
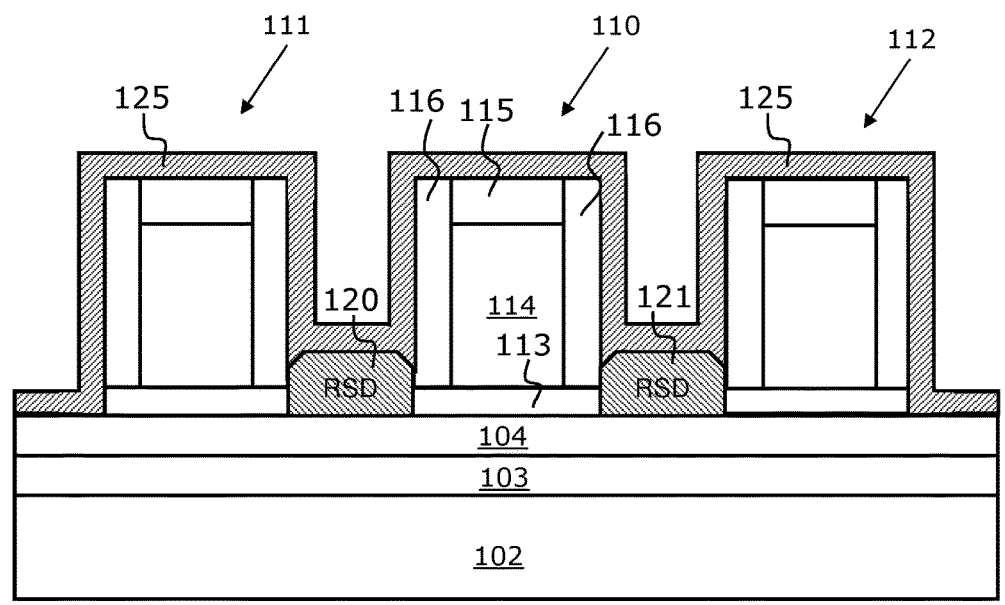

FIG. 2 shows as structure 200 a cross-sectional view of the structure of FIG. 1 after the deposition of a liner 125. The liner 125 has been deposited in a conformal way on the gate stack structure 110, the first dummy gate stack structure 111, the second dummy gate stack structure 112, the raised source 120 and the raised drain 121. The deposition of the liner 125 may be performed by atomic layer deposition, plasma enhanced atomic layer deposition or plasma enhanced chemical vapor deposition. The liner 125 may comprise as liner material $Al_2O_3$, $HfO_2$, $ZrO_2$, AlON, $SiO_2$, $Si_3N_4$ or Hf. The liner 125 acts as an insulator to protect the device from misaligned contacts during middle-of-the-line applications and can withstand wet etching. The liner may have e.g. a thickness between 2 nm to 8 nm and between 3 nm to 7 nm.

Figure 3:
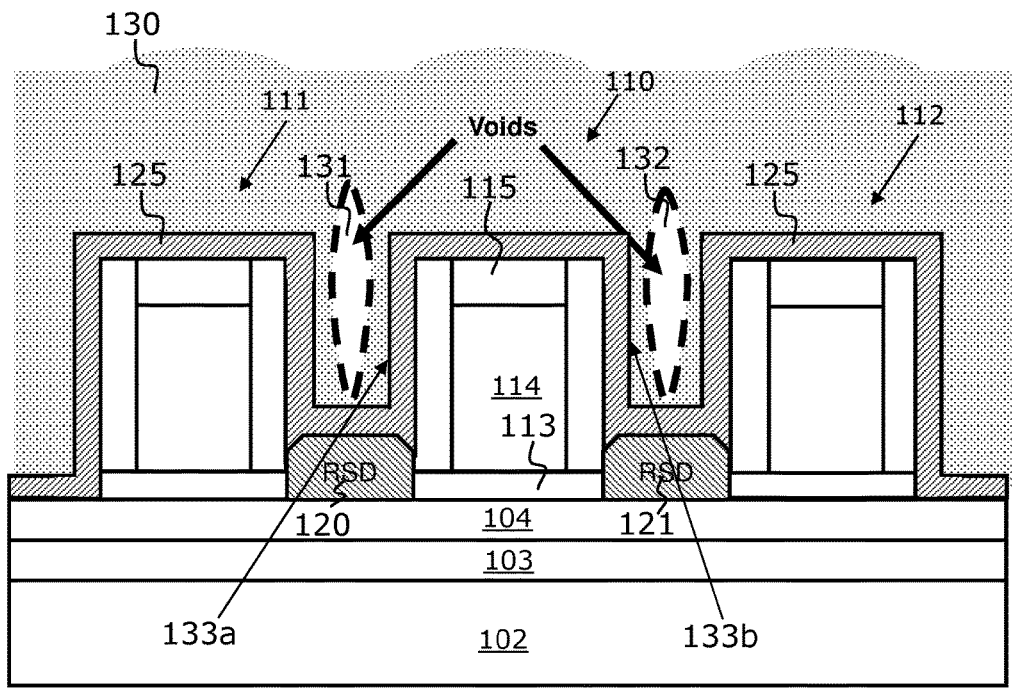

FIG. 3 shows as structure 300 a cross-sectional view of the structure of FIG. 1 after the deposition of an oxide layer 130. The oxide layer 130 has been deposited in a non-conformal way above the gate stack structure 110, the first dummy gate stack structure 111, the second dummy gate stack structure 112, the raised source 120 and the raised drain 121 as well as the remaining surface of the channel layer 104. The non-conformal deposition has created a first void 131 above the raised source 120 and a second void 132 above the raised drain 121. The voids 131, 132 have been formed adjacent to vertical edges 133a, 133b of the gate stack structure 110. According to embodiments the formation of the voids 131, 132 can be well-controlled by a suitable set of process parameters, in particular by adjusting the precursor type, precursor pressure, plasma power and plasma frequency.

In general, the creation of the voids may be facilitated by various non-conformal deposition processes on surfaces with a high topography. According to this embodiment, the voids are facilitated by the first dummy gate stack structure 111 and the second dummy gate stack structure 112. In the following the first void 131 and the second void 132 will be leveraged to form self-aligned contacts to the raised source 120 and the raised drain 121.

The non-conformal deposition of the oxide layer 130 may be performed by chemical vapor deposition, in particular by plasma enhanced chemical vapor deposition. The oxide layer 130 may be formed by $SiO_2$ or any other insulating layer such as low-k dielectrics ($SiO_xC_y$). The oxide layer 130 establishes an interlayer dielectric (ILD).

Figure 4:
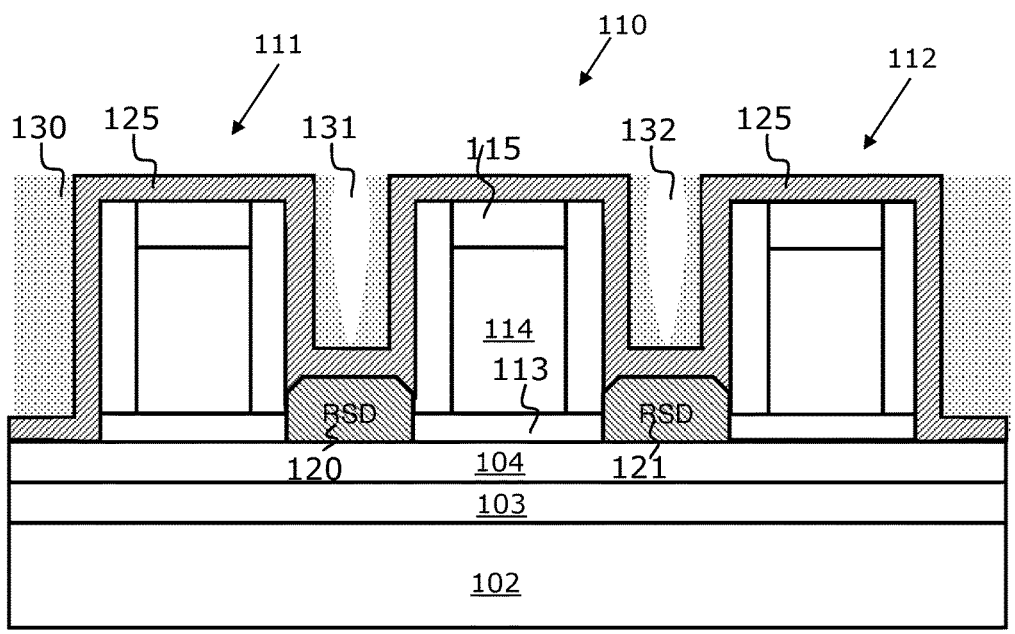

FIG. 4 shows as structure 400 a cross-sectional view of the structure of FIG. 3 after planarization of the oxide layer 130. The planarization may be performed e.g. by chemical mechanical planarization (CMP).

Figure 5:
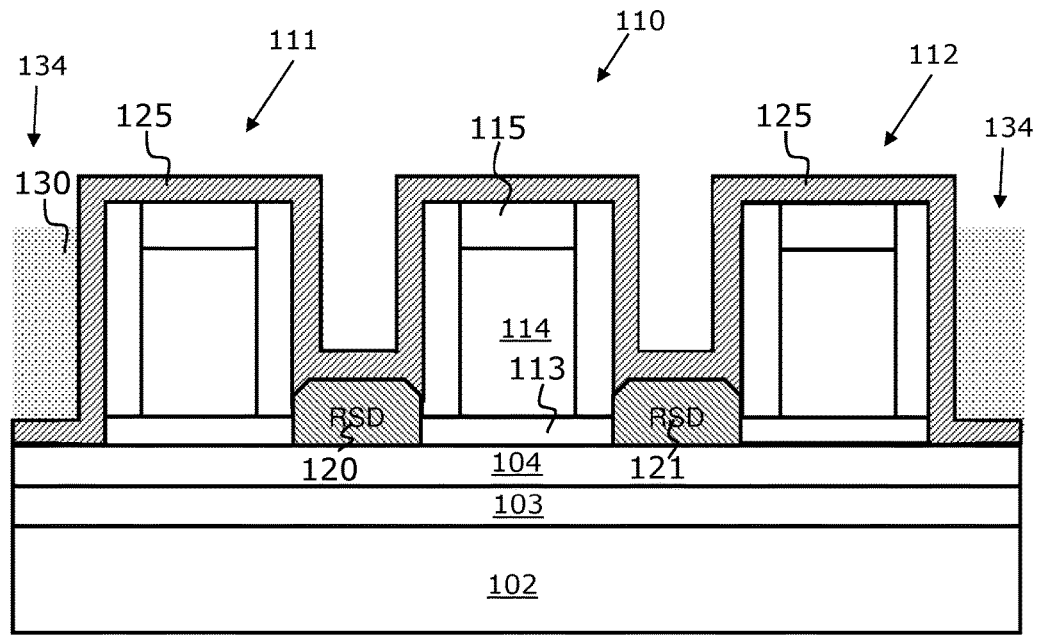

FIG. 5 shows as structure 500 a cross-sectional view of the structure of FIG. 4 after etching the oxide layer 130 for a predefined etching time. The etching time is chosen or controlled such that it is just sufficient to remove the oxide layer 130 above the raised source 120 and the raised drain 121. In other words, the etching time is chosen or controlled such that the raised source 120 and the raised drain 121 will be divested of the oxide layer material covering the raised source 120 and the raised drain 121. As a result, the raised source 120 and the raised drain 121 are only covered by the liner 125.

On the other hand, the oxide layer 130 is kept at least partly on the channel layer 104. More particularly, the oxide layer 130 covers the channel layer 104 outside of the gate stack structure 110, the first dummy gate stack structure 111 and the second dummy gate stack structure 112 in the areas 134 of FIG. 5. This facilitates an insulation of the channel layer from metal contacts to be fabricated in further operations and hence avoids the occurrence of electrical shorts.

Figure 6:
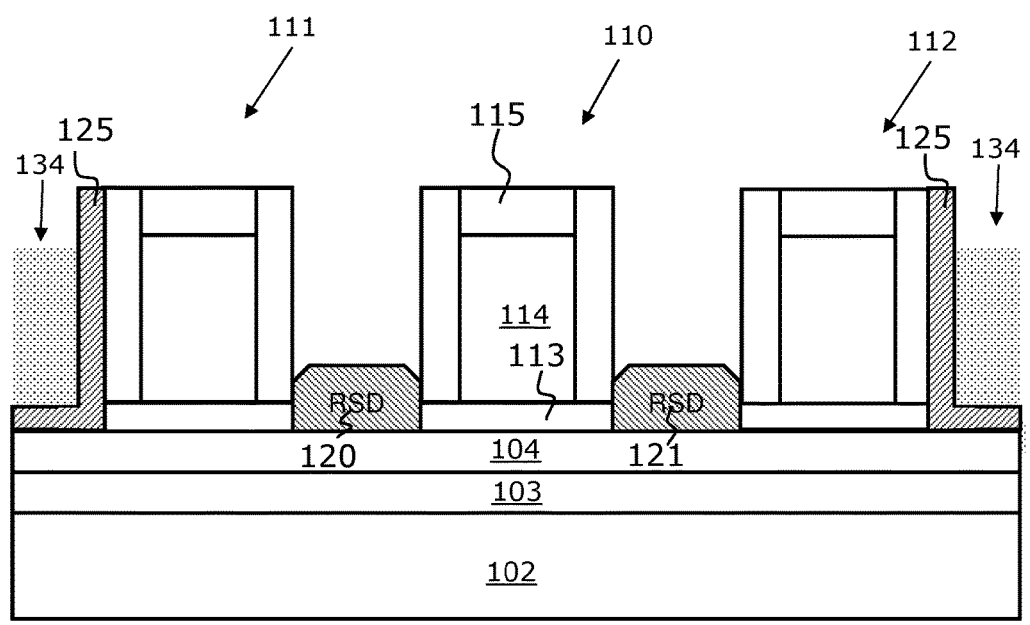

The etching of the oxide layer 130 is performed as an etching of the material of the oxide layer 130, e.g. of $SiO_2$, that is selective to the liner material, e.g. selective to $Al_2O_3$. Accordingly, only the material of the oxide layer 130 is etched away, while the material of the liner remains. According to embodiments dry etching techniques, in particular in fluorine-based chemistry, can be used. According to embodiments the dry-etching techniques may include inductively coupled plasma etching, reactive ion etching, electron cyclotron resonance etching or helicon etching FIG. 6 shows as structure 600 a cross-sectional view of the structure of FIG. 5 after etching of the liner 125. The liner etch may be performed by wet etching techniques, in particular by wet etching techniques based on hydrofluoric acid (HF), tetramethylammonium hydroxide (TMAH) or potassium hydroxide (KOH). As a result, the surface of the raised source 120 and the raised drain 121 have been exposed. This facilitates the subsequent fabrication of contacts as will be described in the following.

Figure 7:
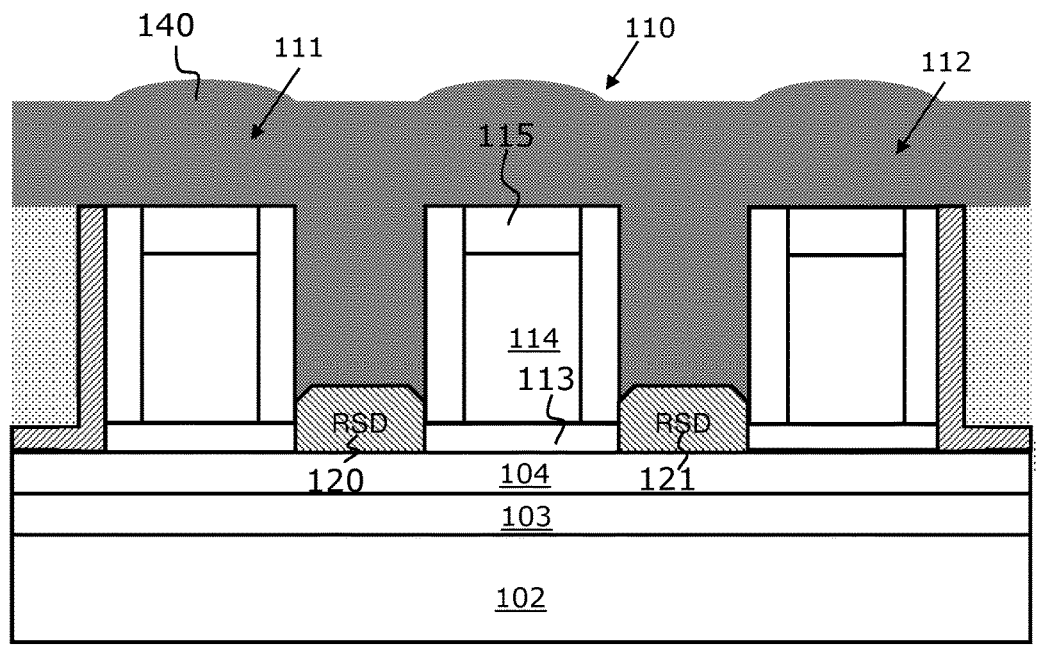

FIG. 7 shows as structure 700 a cross-sectional view of the structure of FIG. 6 after a deposition of a metal layer 140. The deposition of the metal layer 140 may be performed by chemical vapor deposition, physical vapor deposition, metal atomic layer deposition, metal plasma enhanced atomic layer deposition or combinations thereof.

Figure 8:
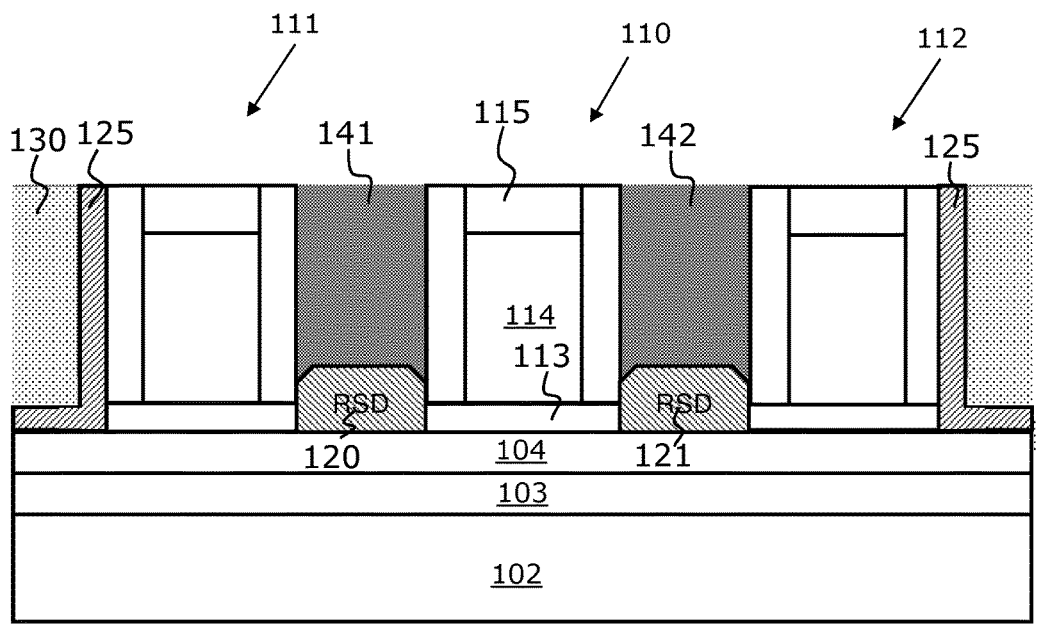

FIG. 8 shows as structure 800 a cross-sectional view of the structure of FIG. 7 after a planarization of the metal layer 140. The planarization may be performed in particular by chemical mechanical planarization.

As a result, a contact 141 has been formed to the raised source 120 and a contact 142 to the raised drain 142. The contacts 141, 142 have been formed in a self-aligned way and hence are self-aligned contacts to the raised source 120 and the raised drain 121 respectively. More particularly, the raised source 120 and the raised drain 121 form self-aligned contacts with respect to the gate stack structure 110. As described above, the formation of the contacts 141, 142 can be implemented without a lithography operation. This provides significant cost advantages and eases the fabrication process.

FIGS. 9-12 illustrate stages of a method for forming a field effect transistor according to embodiments of the invention. More particularly, FIGS. 9-12 illustrate stages for forming a field effect transistor based on raised source/drains having a dual thickness.

Figure 9:
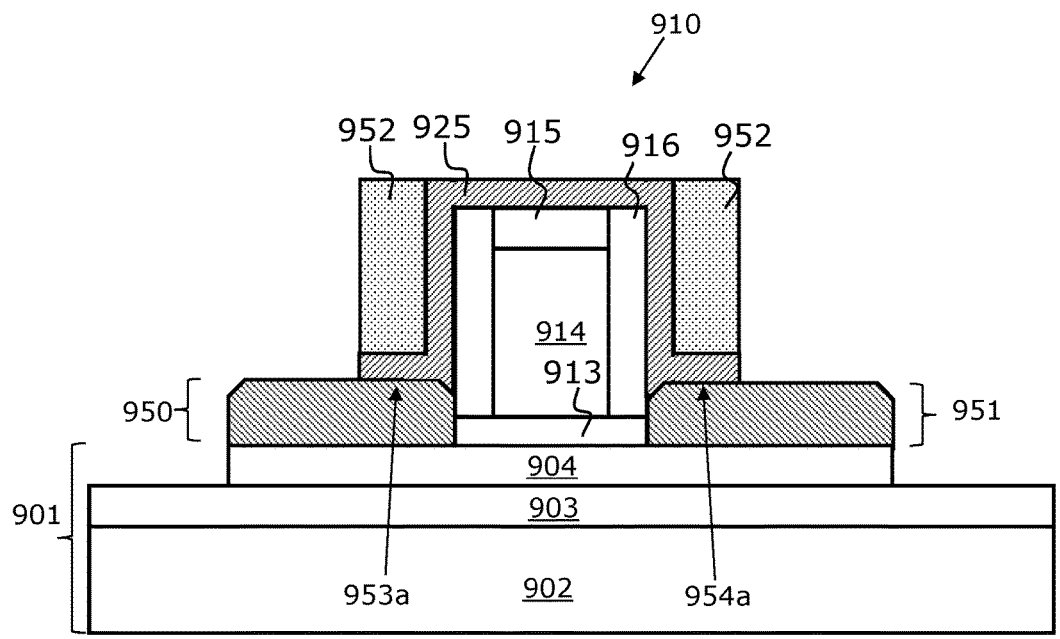

FIG. 9 shows a cross-sectional view of a starting structure 900. The starting structure 900 comprises a substrate 901. The substrate 901 is embodied as a semiconductor-on-insulator substrate comprising a base substrate layer 902, an insulating layer 903 and a channel layer 904 disposed on the insulating layer 903. The base substrate layer 902 may be e.g. embodied as a Si substrate or as a SiGe substrate. On the base substrate layer 902 the insulating layer 903 is provided. The insulating layer 903 may be embodied e.g. as a dielectric layer comprising $SiO_2$. On the insulating layer 903 the channel layer 904 is formed that comprises a semiconductor material.

According to embodiments of the invention, the channel layer 904 could be formed directly on a bulk substrate, e.g. a bulk Si-substrate.

On the channel layer 904 a gate stack structure 910 has been formed. The gate stack structure 910 comprises a gate dielectric layer 913, a gate metal layer 914, a gate cap layer 915 deposited on the gate metal layer 914 and first sidewall spacers 916.

Furthermore, a first raised source layer 950 and a first raised drain layer 951 have been formed on the channel layer 904. More particularly, the first raised source layer 950 and the first raised drain layer 951 have been formed adjacent to the gate stack structure 910. In addition, a liner 925 has been deposited in a conformal way on the gate stack structure 910 and the first sidewall spacers 916. The liner 925 may comprise as liner material $Al_2O_3$, $HfO_2$, $ZrO_2$, AlON, $SiO_2$, $Si_3N_4$ or Hf. This liner 925 acts as an insulator to protect the device from misaligned contacts during middle-of-the-line applications and can withstand wet etching.

Furthermore, second sidewall spacers 952 have been formed on a first part 953a of the first raised source layer 950 and a first part 954a of the first raised drain layer 951.

Figure 10:
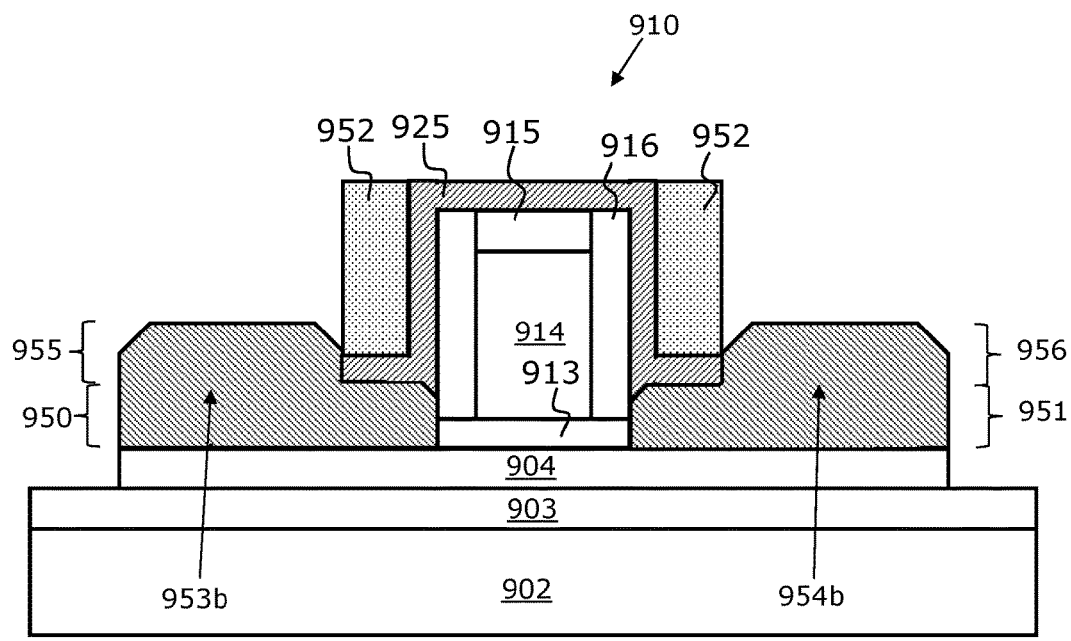

FIG. 10 shows as structure 1000 a cross-sectional view of the structure of FIG. 9 after growing a second raised source layer 955 on a second part 953b of the first raised source layer 950 adjacent to the second sidewall spacers 952. Furthermore, a second raised drain layer 956 has been grown on a second part 954b of the first raised drain layer 951 adjacent to the second sidewall spacers 952. The second raised source layer 955 and the second raised drain layer 956 may be grown by selective epitaxy.

Figure 11:
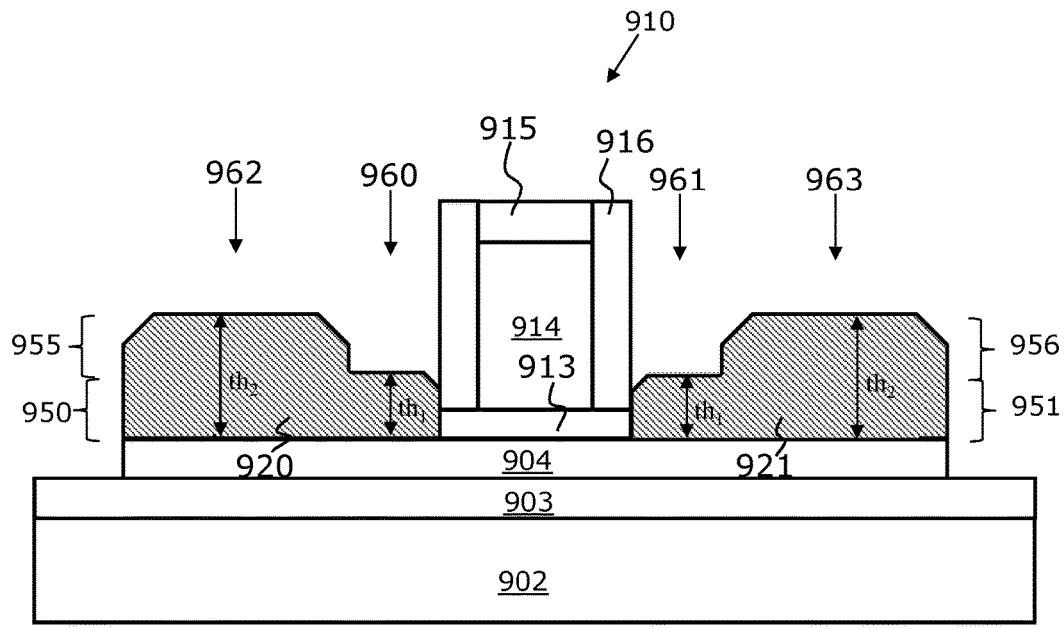

FIG. 11 shows as structure 1100 a cross-sectional view of the structure of FIG. 10 after removing the liner 925 and the second sidewall spacers 952. The removal of the second sidewall spacers 952 and the liner 925 may be performed by an etching selective to the material of the raised source/ drains and selective to the material of the first sidewall spacer 916. As an example, a wet etch of SiN in hot phosphoric acid can be used.

As a result, a first raised source part 960 and a first raised drain part 961 have been formed adjacent to the gate stack structure 910. The first raised source part 960 and the first raised drain part 961 have a first thickness th1. Furthermore, a second raised source part 962 and a second raised drain part 963 have been formed. The second raised source part 962 and the second raised drain part 963 have a second thickness th2. The second thickness th2 is greater than the first thickness th1. Accordingly, a raised source 920 and raised drain 921 with a dual thickness th1, th2 have been formed.

Figure 12:
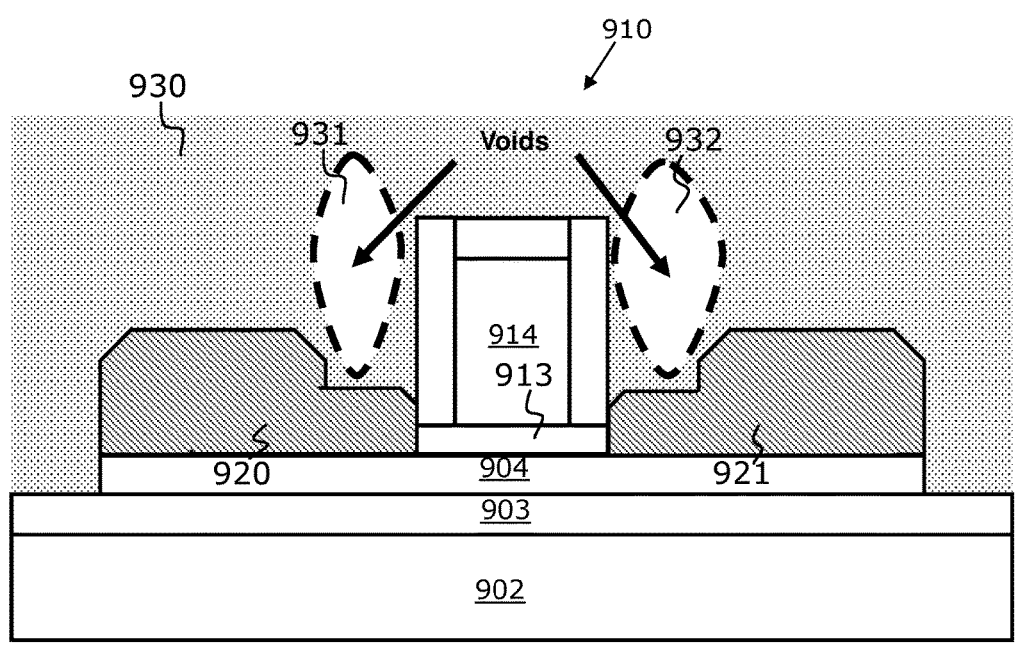

FIG. 12 shows as structure 1200 a cross-sectional view of the structure of FIG. 11 after the deposition of an oxide layer 930. The oxide layer 930 has been deposited in a non-conformal way above the gate stack structure 910. The non-conformal deposition has created a first void 931 above the first raised source part 960 and a second void 932 above the first raised drain part 961. According to embodiments the formation of the voids 931, 932 can be well-controlled by a suitable set of process parameters.

The non-conformal deposition of the oxide layer 930 may be performed by chemical vapor deposition, in particular by plasma enhanced chemical vapor deposition.

According to embodiments, the voids 931, 932 are facilitated by creating a topology having a raised source 920 and raised drain 921 with a dual thickness th1, th2. Subsequently, the first void 931 and the second void 932 may be leveraged to form self-aligned contacts to the first raised source part 960 and the first raised drain part 961 in a corresponding way as described with reference to FIGS. 4 to 8.

Figure 13:
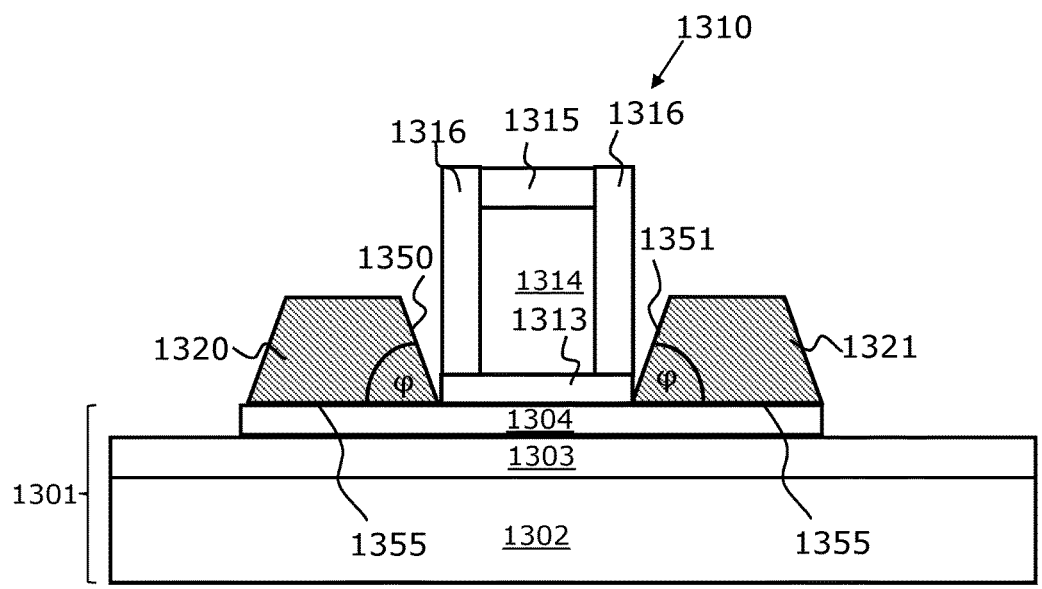
Figure 14:
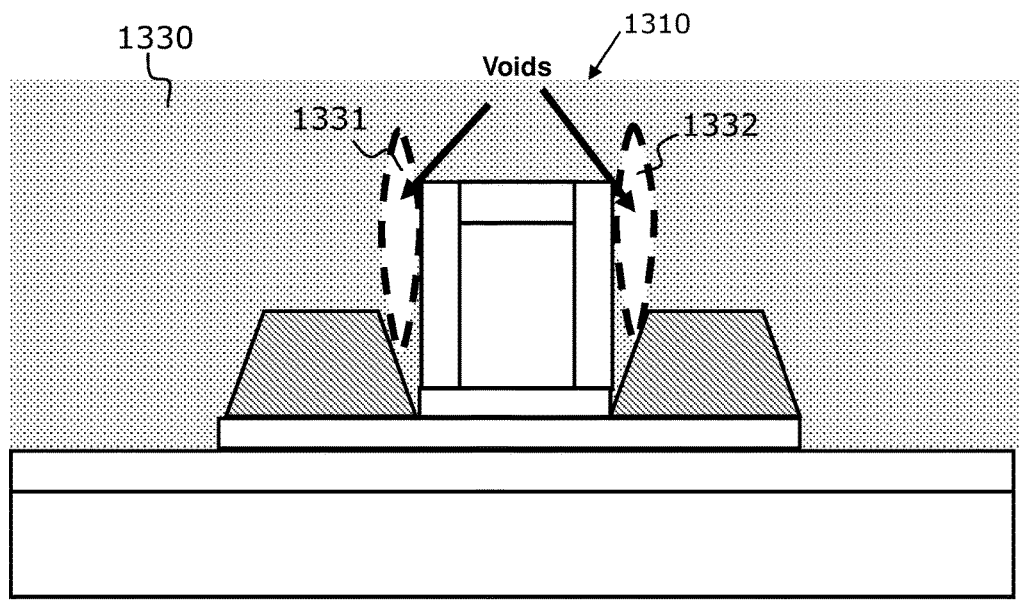

FIGS. 13 and 14 illustrate stages of a method for forming a field effect transistor according to embodiments of the invention. More particularly, FIGS. 13 and 14 illustrate stages for forming a field effect transistor based on "faceted" raised source/drains.

FIG. 13 shows a cross-sectional view of a starting structure 1300. The starting structure 1300 comprises a substrate 1301. The substrate 1301 is embodied as a semiconductor-on-insulator substrate comprising a base substrate layer 1302, an insulating layer 1303 and a channel layer 1304 disposed on the insulating layer 1303. The base substrate layer 1302 may be e.g. embodied as a Si substrate or as a SiGe substrate. On the base substrate layer 1302, the insulating layer 1303 is provided. The insulating layer 1303 may be embodied e.g. as a dielectric layer comprising $SiO_2$. On the insulating layer 1303 the channel layer 1304 is formed that comprises a semiconductor material.

On the channel layer 1304 a gate stack structure 1310 has been formed. The gate stack structure 1310 comprises a gate dielectric layer 1313, a gate metal layer 1314, a gate cap layer 1315 deposited on the gate metal layer 1314 and sidewall spacers 1316.

On the channel layer 1304 a raised source 1320 and a raised drain 1321 have been epitaxially formed. The raised source 1320 and the raised drain 1321 have a faceted shape. More particularly, the raised source 1320 comprises a faceted side portion 1350 adjacent to the gate stack structure 1310 and the raised drain 1321 comprises a faceted side portion 1351 adjacent to the gate stack structure 1310. The faceted side portions 1350, 1351 may be angled with an angle φ from 20 degree to 85 degree, or with an angle from 45 degree to 65 degree relative to a bottom surface 1355 of the raised source 1320 and the raised drain 1351. In embodiments of the invention, the angle φ for each of the faceted side portions 1350, 1351 is substantially less than 90 degrees and substantially greater than zero degrees. Moreover, the angle of one of the faceted side portions 1350, 1351 can be different than the angle of the other one of the faceted side portions 1350, 1351.

FIG. 14 shows as structure 1400 a cross-sectional view of the structure of FIG. 13 after the deposition of an oxide layer 1330. The oxide layer 1330 has been deposited in a non-conformal way above the gate stack structure 1310. The non-conformal deposition has created a first void 1331 above the faceted side portions 1350 of the raised source 1320 and a second void 1332 above the faceted side portions 1351 of the raised drain 1321.

The non-conformal deposition of the oxide layer 1330 may be performed by chemical vapor deposition, in particular by plasma enhanced chemical vapor deposition.

According to embodiments of the invention, the voids 1331, 1332 are facilitated by creating a topology having a raised source 1320 and raised drain 1321 with faceted side portions 1350, 1351. Subsequently, the first void 1331 and the second void 1332 may be leveraged to form self-aligned contacts to the raised source 1320 and the raised drain 1321 as described with reference to FIGS. 4 to 8.

According to embodiments the growth rates for (100) vs. (110) vs (111) oriented planes are engineered so that during the epitaxial growth on (100) Si faceted raised/source drains are obtained. As can be seen from FIG. 13, the faceted raised source/drains 1320, 1321 comprise the faceted side portions 1350, 1351 rather than completely abutting the gate stack structure 1310.

Figure 16:
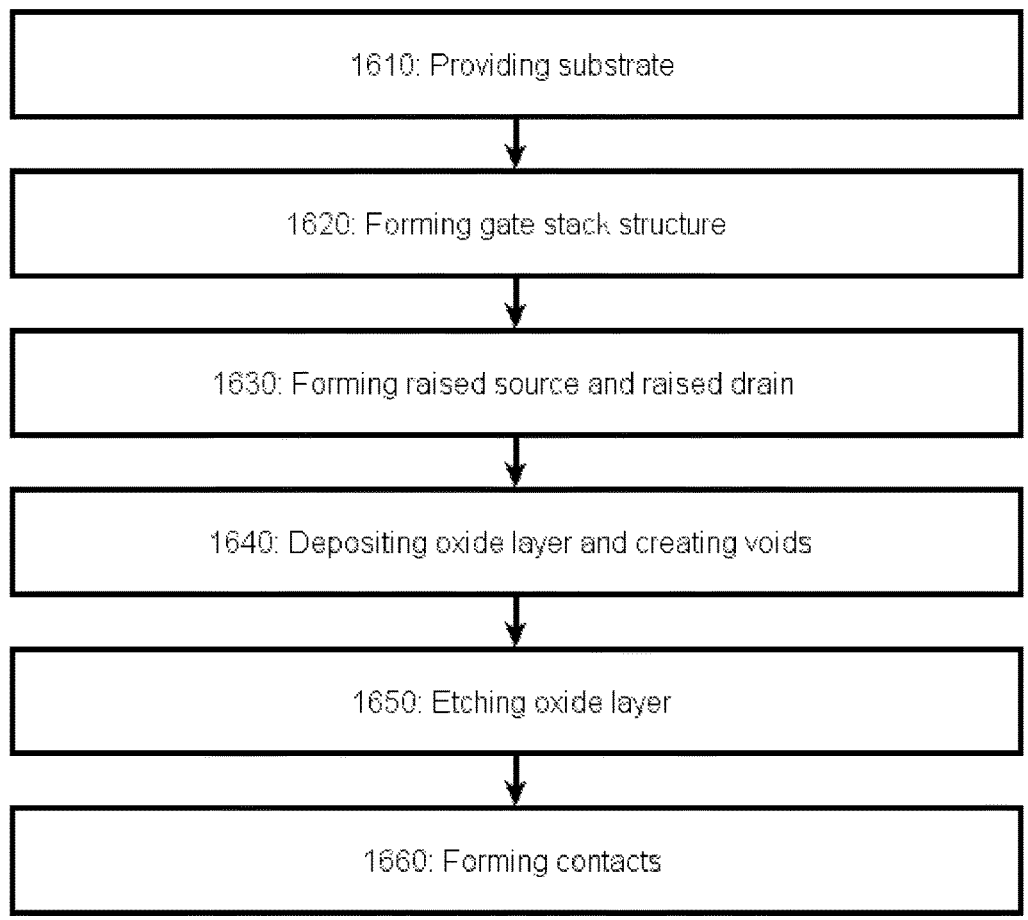
FIG. 16 shows a flow chart of a method according to embodiments of the invention.

FIG. 16 shows a flow chart 1600 of a method for forming a field effect transistor according to embodiments of the invention.

At an operation 1610, a substrate with a channel layer is provided.

At an operation 1620, a gate stack structure is formed on the channel layer.

At an operation 1630, a raised source and a raised drain is formed on the channel layer.

At an operation 1640, an oxide layer is deposited in a non-conformal way above the gate stack structure, the raised source and the raised drain. The oxide layer is formed such that a first void above the raised source and a second void above the raised drain are created.

At an operation 1650, the oxide layer is asymmetrically etched for a predefined etching time. Thereby the oxide layer is removed above the raised source and the raised drain, while it is kept at least partly on the channel layer.

At an operation 1660, contacts to the raised source and the raised drain are formed.

Integrated circuit chips resulting from the techniques described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Aspects of the present invention are described above with reference to semiconductor processing operations according to embodiments of the invention. It will be understood that the operations can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Figure 15:
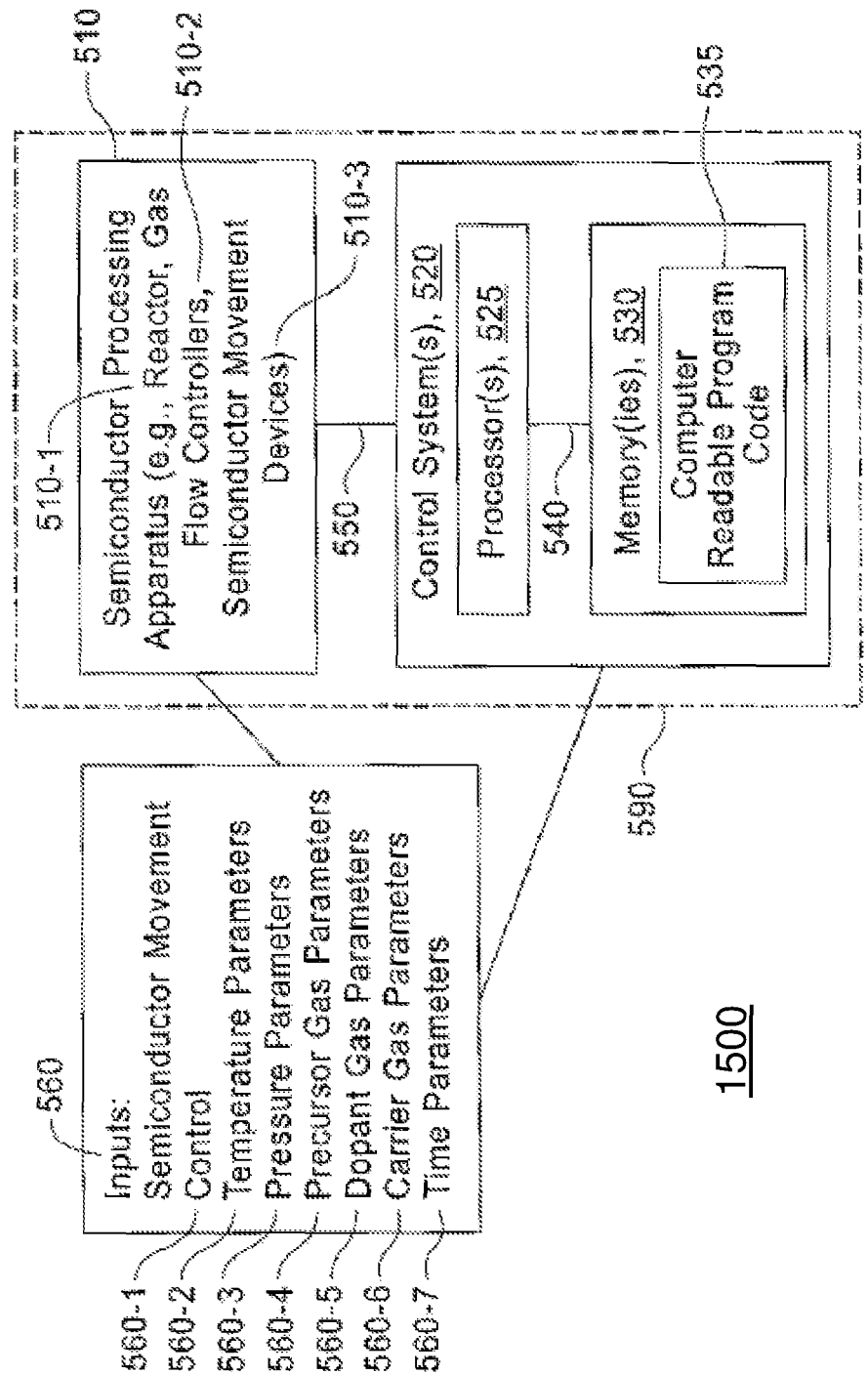
FIG. 15 shows a system suitable for performing the processing shown in FIGS. 1-14.

For instance, an exemplary system 1500 suitable for performing the processing shown in FIGS. 1-14 and 16 (and additional processing if desired) is shown in FIG. 15. In FIG. 15, one or more control systems 520 (e.g., computers) comprise one or more processors 525 coupled to one or more memories 530 via one or more networks (e.g., buses) 540. The one or more control systems 520 are coupled via one or more networks 550 to semiconductor processing apparatus 510 such as a reactor 510-1 (e.g., CVD tool), gas flow controllers 510-2 (e.g., if separate from the reactor 510-1) and semiconductor movement devices 510-3 (e.g., wafer positioning and movement systems). The one or more memories 530 comprise computer readable program code suitable for causing the semiconductor processing apparatus 510 to perform operations such as the operations illustrated in FIGS. 1-14.

The one or more control systems 520 may also manipulate the inputs 560 to the semiconductor processing apparatus 510. Such inputs 560 may include, e.g., semiconductor movement control parameters 560-1 (e.g., at what time a wafer should be moved, where the wafer should be placed), temperature parameters 560-2 (e.g., temperature of the wafer, potentially with ramp up or down rates), pressure parameters 560-3 (e.g., of the interior of the reactor 510-1), precursor gas parameters 560-4 (e.g., flow rates for particular precursors, which precursor gas should be used and for how long), dopant gas parameters 560-5 (e.g., flow rates for particular dopant gases, which dopant gas should be used and for how long), carrier gas parameters 560-6 (e.g., flow rates, which carrier gas should be used and for how long), and time parameters 560-7 (e.g., how long the reactor should process wafers at particular temperatures). It should be noted that a semiconductor processing apparatus 510 may include a corresponding control system 520 to create an integral semiconductor processing apparatus 590. For instance, an "integral" reactor 590 may have a corresponding control system 520 attached to a reactor 510-2. The control system 520 in such a case may be networked via one or more networks 550 to enable the control system 520 to be loaded with the computer readable program code 535.

Accordingly, the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a substrate with a channel layer;
   a gate stack structure disposed on the channel layer;
   a raised source and a raised drain disposed on the channel layer;
   an oxide layer disposed on one or more portions of the semiconductor device;
   a self-aligned contact disposed on the raised source and the raised drain; and
   a first dummy gate stack structure adjacent to the raised source and a second dummy gate stack structure adjacent to the raised drain.

2. A semiconductor device as claimed in claim 1, wherein the gate stack structure comprises:
   a gate dielectric layer;
   a gate metal layer;
   a gate cap layer deposited on the gate metal layer; and
   sidewall spacers.

3. A semiconductor device as claimed in claim 2, wherein the gate dielectric layer is formed as a high-k dielectric layer selected from the group consisting of: $HfO_2$, HfON, HfSiON, $ZrO_2$, ZrON, $HfO_2$, HfON, $ZrO_2$, ZrON, $LaO_3$, La—Al—O, La—Lu—O, SiN and SiON.

4. A semiconductor device as claimed in claim 1, further comprising:
   a liner on one or more portions of the semiconductor device, the gate stack structure, the raised source and the raised drain.

5. A semiconductor device as claimed in claim 4, wherein the liner comprises a material selected from the group consisting of: $Al_2O_3$, $HfO_2$, $ZrO_2$, AlON, $SiO_2$, $Si_3N_4$ and Hf.

6. A semiconductor device as claimed in claim 4, wherein the liner includes one or more removed portions above the raised source and the raised drain.

7. A semiconductor device as claimed in claim 1, wherein the self-aligned contact comprises a metal layer.

8. A semiconductor device as claimed in claim 1, wherein the substrate is a bulk substrate of a semiconductor material.

9. A semiconductor device as claimed in claim 1, wherein the substrate is a semiconductor-on-insulator substrate comprising a base substrate layer, an insulating layer and the channel layer on the insulating layer.

10. A device as claimed in claim 1, wherein the channel layer is comprised of one of: $Si_xGe_{1-x}$ where x=0 to 1; $In_xGa_{1-x}As$ where x=0 to 1; InP; InGaSb and further alloyed combinations of (In, Ga) (As, Sb, P).

11. A semiconductor device as claimed in claim 10, wherein the faceted side portions are angled with an angle from 30 degree to 80 degree relative to a bottom surface of the raised source and the raised drain.

12. A semiconductor device as claimed in claim 1, wherein the raised source and the raised drain comprises:
    a first raised source part and a first raised drain part, the first raised source part and the first raised drain part having a first thickness and being arranged adjacent to the gate stack structure; and
    a second raised source part and a second raised drain part, the second raised source part and the second raised drain part having a second thickness, wherein the second thickness is greater than the first thickness.

13. A semiconductor device as claimed in claim 1, wherein the raised source and the raised drain comprises:
   a faceted shape, wherein the raised source and the raised drain each comprise a faceted side portion adjacent to the gate stack structure.

14. A semiconductor device as claimed in claim 1, wherein the self-aligned contact borders a dummy gate stack structure, the gate stack structure, and the raised source or the raised drain.

15. A semiconductor device as claimed in claim 1, wherein the self-aligned contact comprises:
   a first self-aligned contact that borders the first dummy gate stack structure, the gate stack structure and the raised source; and
   a second self-aligned contact that borders the second dummy gate stack structure, the gate stack structure and the raised drain.

* * * * *